(12) United States Patent
Shin et al.

(10) Patent No.: US 12,469,731 B2
(45) Date of Patent: Nov. 11, 2025

(54) METHOD FOR MANUFACTURING DISPLAY DEVICE

(71) Applicant: LG ELECTRONICS INC., Seoul (KR)

(72) Inventors: Yongil Shin, Seoul (KR); Jinhyung Lee, Seoul (KR); Dohee Kim, Seoul (KR); Dohwan Yang, Seoul (KR); Kisu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 341 days.

(21) Appl. No.: 18/023,998

(22) PCT Filed: Sep. 22, 2020

(86) PCT No.: PCT/KR2020/012749
§ 371 (c)(1),
(2) Date: Feb. 28, 2023

(87) PCT Pub. No.: WO2022/065524
PCT Pub. Date: Mar. 31, 2022

(65) Prior Publication Data
US 2023/0268214 A1    Aug. 24, 2023

(51) Int. Cl.
*H01L 21/68* (2006.01)
*H01L 25/075* (2006.01)
(Continued)

(52) U.S. Cl.
CPC ............ *H01L 21/68* (2013.01); *H01L 25/075* (2013.01); *H10H 20/018* (2025.01); *H10H 20/832* (2025.01)

(58) Field of Classification Search
CPC ......... H01L 21/67144; H01L 21/67709; H01L 21/67721; H01L 21/68; H01L 25/075; H10H 20/01; H10H 20/018; H10H 20/832
See application file for complete search history.

(56) References Cited

U.S. PATENT DOCUMENTS 11,735,701 B2 *  8/2023  Kim ..................... H01L 25/167
                                                      257/79
12,308,352 B2 *  5/2025  Kang ..................... H01L 24/05
(Continued)

FOREIGN PATENT DOCUMENTS

KR    10-2019-0091072 A    8/2019
KR    10-2019-0131309 A    11/2019
(Continued)

*Primary Examiner* — Saul Rodriguez
*Assistant Examiner* — Brendan P Tighe
(74) *Attorney, Agent, or Firm* — Birch, Stewart, Kolasch & Birch, LLP

(57) ABSTRACT

A method for manufacturing a display device according to the present invention is characterized by comprising the steps of: supplying semiconductor light-emitting elements in a first chamber containing a fluid; disposing a distribution device, in which a plurality of magnets are arranged, on one side of the first chamber; rotating the distribution device such that the semiconductor light-emitting elements form a continuous pattern along the arrangement direction of the plurality of magnets; and stopping the distribution device such that the semiconductor light-emitting elements are distributed to a plurality of dummies, wherein in the step of stopping the distribution device, the plurality of dummies are formed at positions corresponding to the plurality of magnets.

15 Claims, 16 Drawing Sheets

(51) Int. Cl.
    *H10H 20/01*       (2025.01)
    *H10H 20/832*     (2025.01)

(56) References Cited

U.S. PATENT DOCUMENTS

| | | | |
|---|---|---|---|
| 12,324,292 B2 * | 6/2025 | Kim | H10H 20/01 |
| 2018/0102352 A1 | 4/2018 | Sasaki et al. | |
| 2019/0326477 A1 * | 10/2019 | Kim | H01L 25/0753 |
| 2021/0399160 A1 * | 12/2021 | Cho | H01L 24/95 |
| 2022/0367423 A1 * | 11/2022 | Yang | H10H 20/857 |

FOREIGN PATENT DOCUMENTS

| | | | | |
|---|---|---|---|---|
| KR | 10-2020-0026725 A | 3/2020 | | |
| KR | 10-2020-0048762 A | 5/2020 | | |
| WO | WO-2020091252 A1 * | 5/2020 | | H01L 21/67144 |

\* cited by examiner (a)

(b)

METHOD FOR MANUFACTURING DISPLAY DEVICE

CROSS REFERENCE TO RELATED APPLICATION

This application is the National Phase of PCT International Application No. PCT/KR2020/012749, filed on Sep. 22, 2020, which is hereby expressly incorporated by reference into the present application.

TECHNICAL FIELD

The present disclosure relates to a method for manufacturing a display device including semiconductor light-emitting elements each having a size of several to several tens of μm, and more particularly, to a method for distributing semiconductor light-emitting elements.

BACKGROUND ART

In recent years, in the field of display technology, liquid-crystal displays (LCDs), organic light-emitting diodes (OLED) displays, microLED displays, etc. have been competing to realize large-scale displays.

Among others, displays using semiconductor light-emitting diodes (microLEDs) with a diameter or cross-sectional area less than 100 in may offer very high efficiency because the displays do not need a polarizer to absorb light.

However, in order to implement large-scale microLED displays, several millions of semiconductor light-emitting diodes (elements) are required, which makes it difficult to transfer the devices compared to other technologies.

Some of the technologies currently in development for the transfer process of microLEDs include pick & place, laser lift-off (LLO), and self-assembly. Among these technologies, the self-assembly approach is a method that allows semiconductor light-emitting elements to find their positions on their own in a fluid, which is most advantageous in realizing large-screen display devices.

DISCLOSURE OF INVENTION

Technical Problem

The present disclosure relates to reducing a deviation of an assembly rate within a substrate during self-assembly, and an aspect of the present disclosure is to provide a method for uniformly distributing semiconductor light-emitting elements so that the semiconductor light-emitting elements can be uniformly supplied to all assembly sites of a substrate.

Solution to Problem

A method for manufacturing a display device according to the present disclosure may include supplying semiconductor light-emitting elements into a first chamber containing a fluid, disposing a distribution device, on which a plurality of magnets are arranged, at one side of the first chamber, rotating the distribution device so that the semiconductor light-emitting elements form a continuous pattern along an arrangement direction of the plurality of magnets, and stopping the distribution device to distribute the semiconductor light-emitting elements into a plurality of piles. In the stopping of the distribution device, the plurality of piles may be formed at positions corresponding to the plurality of magnets.

According to the present disclosure, the disposing the distribution device, on which the plurality of magnets are arranged, at the one side of the first chamber may be performed to arrange the distribution device that includes a plate on which the plurality of magnets are arranged at predetermined distances, and a rotational shaft extending from a center of the plate in a direction perpendicular to the plate.

According to the present disclosure, the disposing the distribution device, on which the plurality of magnets are arranged, at the one side of the first chamber may include disposing a temporary substrate made of glass on one side of the first chamber, arranging the distribution device so that the plurality of magnets face the temporary substrate, and bringing the plurality of magnets into contact with temporary substrate.

According to the present disclosure, the rotating the distribution device may be performed to rotate the plate in one direction centering on the rotational shaft.

According to the present disclosure, the plurality of magnets may be arranged along a circumference of the plate, and in the step of rotating the distribution device, the semiconductor light-emitting elements may form a continuous pattern having a predetermined thickness along the circumference of the plate.

According to the present disclosure, a contact state between the plurality of magnets and the temporary substrate may be maintained while the step of rotating the distribution device is in progress.

According to the present disclosure, the plurality of magnets may be arranged at distances greater than a diameter of each magnet.

According to the present disclosure, the supplying semiconductor light-emitting elements into a first chamber containing a fluid may be performed to supply the semiconductor light-emitting elements in a pile form to at least one position.

According to the present disclosure, the method may further include measuring volumes of a plurality of piles formed by distributing the semiconductor light-emitting elements, and the rotating the distribution device may be performed again when a deviation of the measured volumes among the plurality of piles is 5% or more.

According to the present disclosure, the method may further include transferring the plurality of piles formed by distributing the semiconductor light-emitting elements to a second chamber containing a fluid.

Advantageous Effects of Invention

According to the present disclosure, semiconductor light-emitting elements can be uniformly distributed to all assembly sites of a substrate within a predetermined error range during self-assembly, and an amount or ratio of semiconductor light-emitting elements to be supplied to each assembly site can be controlled if necessary.

Also, an assembly rate deviation in a substrate can be solved. When manufacturing a display device including red, green, and blue semiconductor light-emitting elements, the red, green, and blue semiconductor light-emitting elements can be supplied at an appropriate ratio. This can overcome an assemblage rate deviation for each color emitted.

MODE FOR THE INVENTION

Description will now be given in detail according to embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the embodiment described herein can be applied as long as it can include a display even in a new product form to be developed later.

Figure 1:
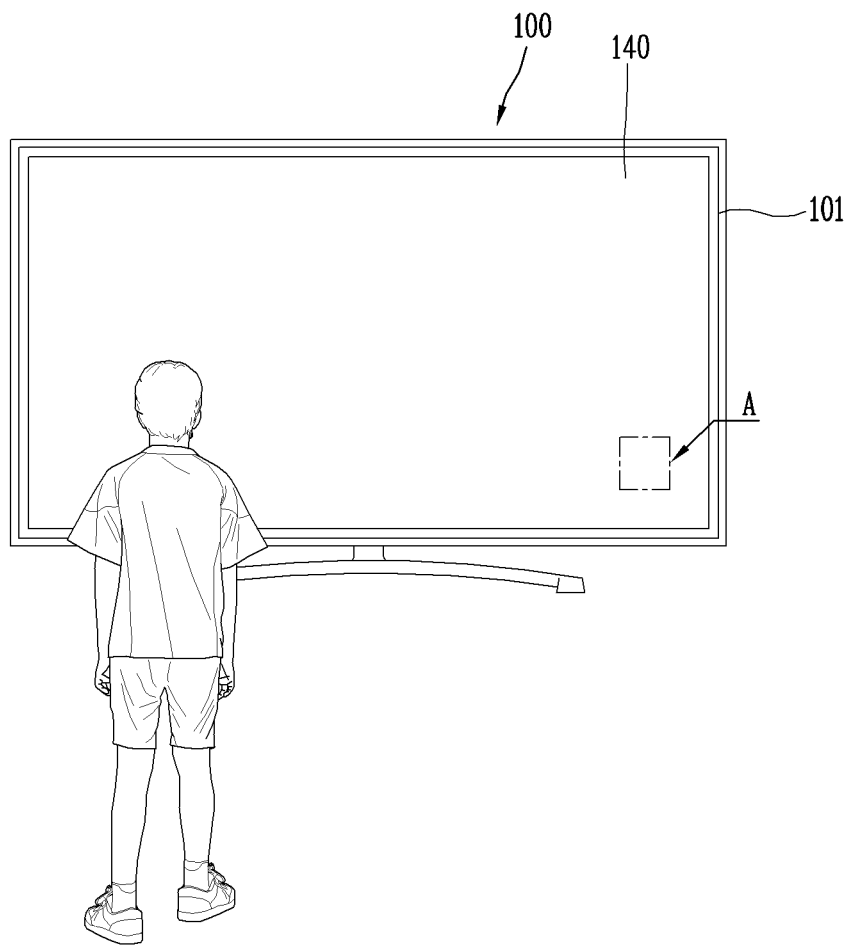
FIG. 1 is a conceptual view illustrating one embodiment of a display device using semiconductor light-emitting elements.
Figure 2:
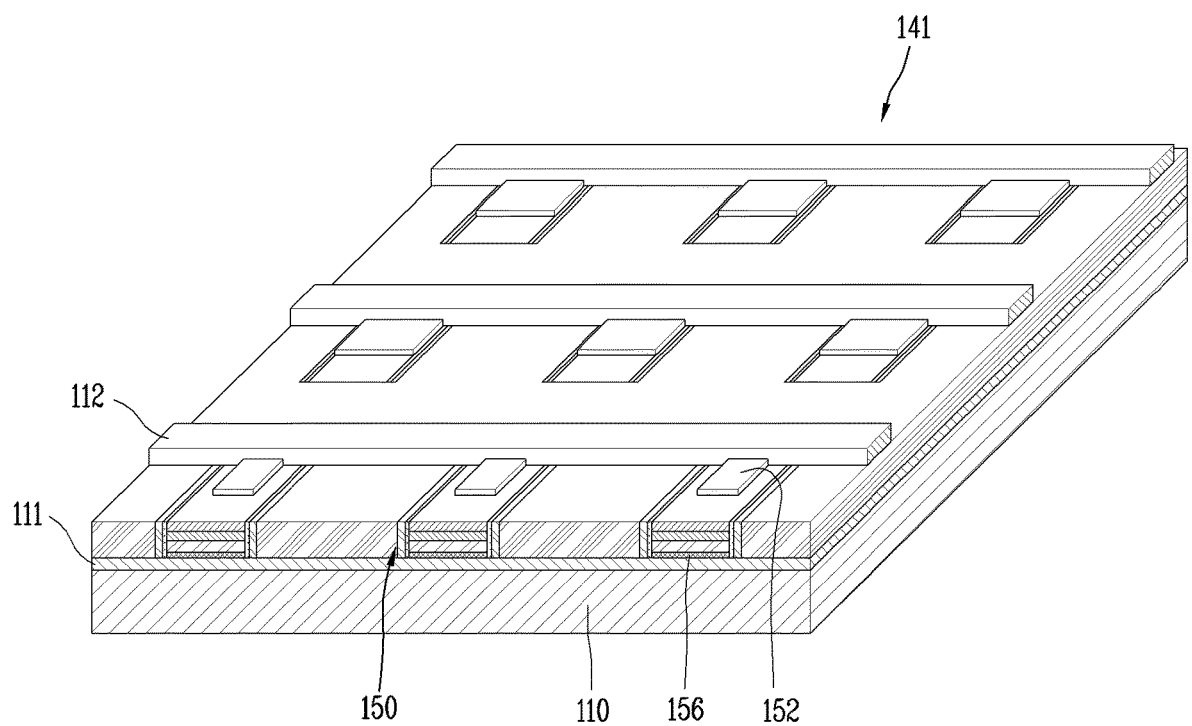
FIG. 2 is a partial enlarged view of the portion A in the display device of FIG. 1.
Figure 3:
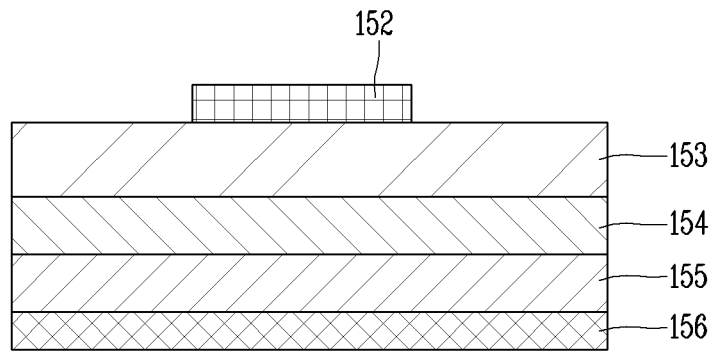
FIG. 3 is an enlarged view of the semiconductor light-emitting element of FIG. 2.
Figure 4:
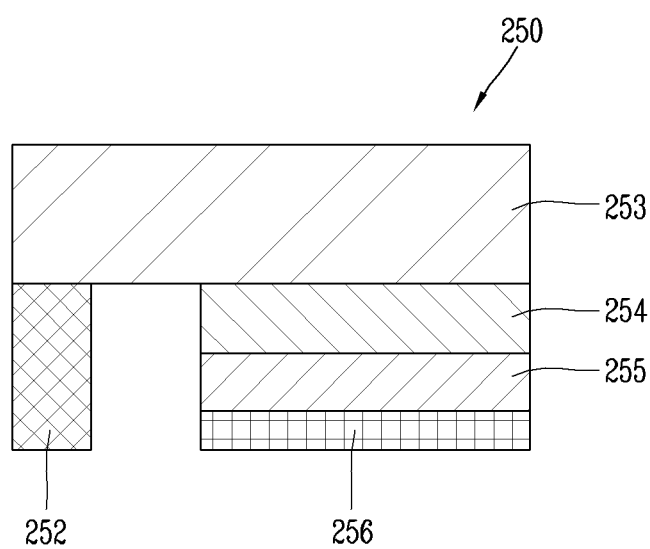
FIG. 4 is an enlarged view illustrating another embodiment of the semiconductor light-emitting element of FIG. 2.

FIG. 1 is a conceptual view illustrating one embodiment of a display device using semiconductor light-emitting elements, FIG. 2 is a partial enlarged view of a portion A in the display device of FIG. 1, FIG. 3 is an enlarged view of the semiconductor light-emitting element of FIG. 2, and FIG. 4 is a view illustrating another embodiment of the semiconductor light-emitting element of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting elements) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

Such a vertical semiconductor light-emitting element may include a p-type electrode 156, a p-type semiconductor layer 155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting element. The electrodes can be disposed in an upward/ downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a flip-type light-emitting element each may be used as a green semiconductor light-emitting element, blue semiconductor light-emitting element, or red semiconductor light-element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. The micro-sized semiconductor light-emitting elements 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting elements. In addition, the self-assembly method described in this specification can be applied to both horizontal semiconductor light-emitting elements and vertical semiconductor light-emitting elements.

Figure 5A:
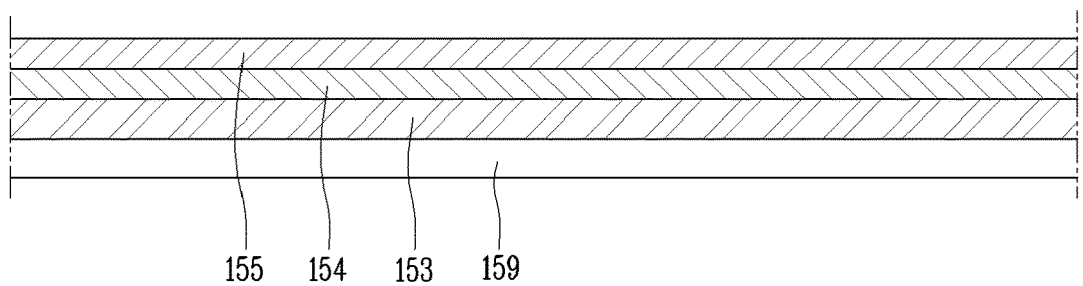
FIGS. 5A to 5E are conceptual diagrams illustrating a new process for manufacturing a semiconductor light-emitting element.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary embodiment is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
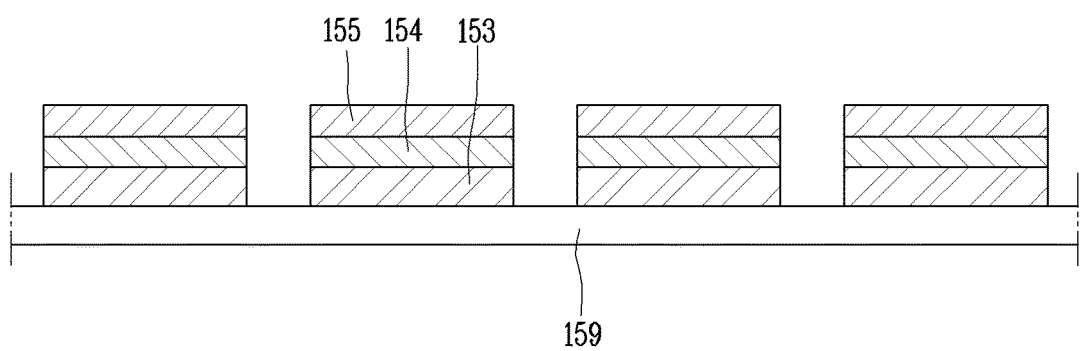

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting element array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
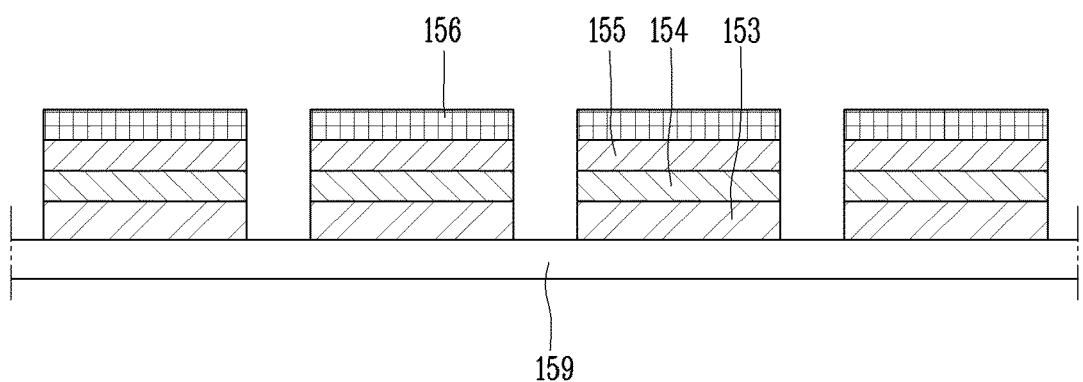

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
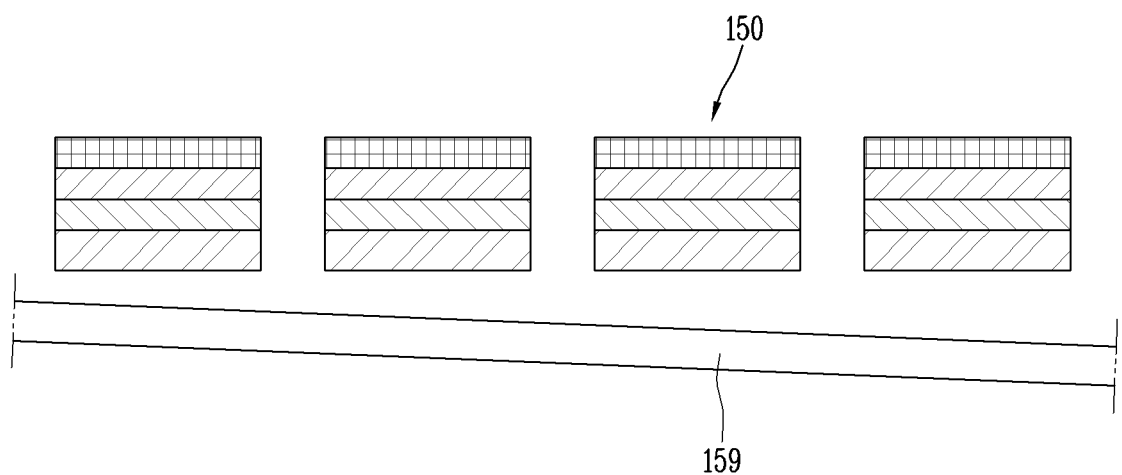

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
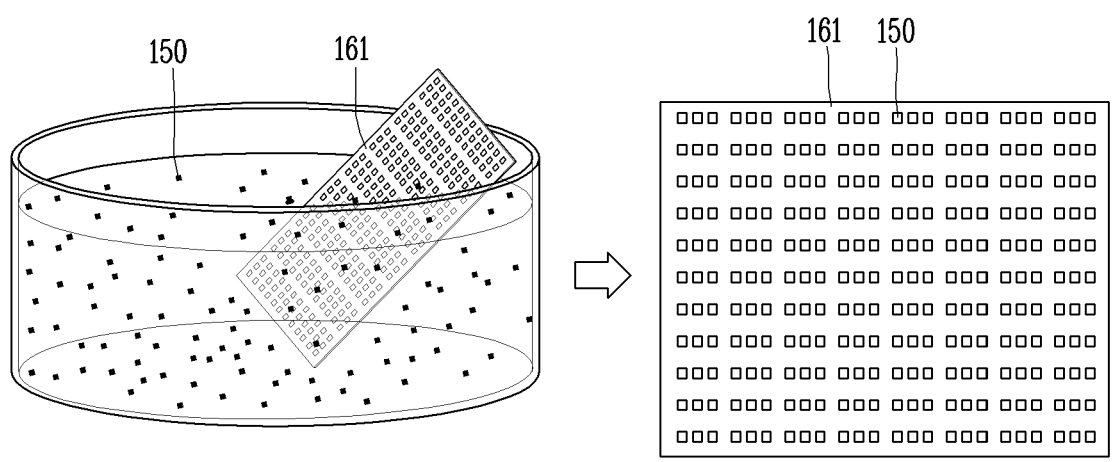

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
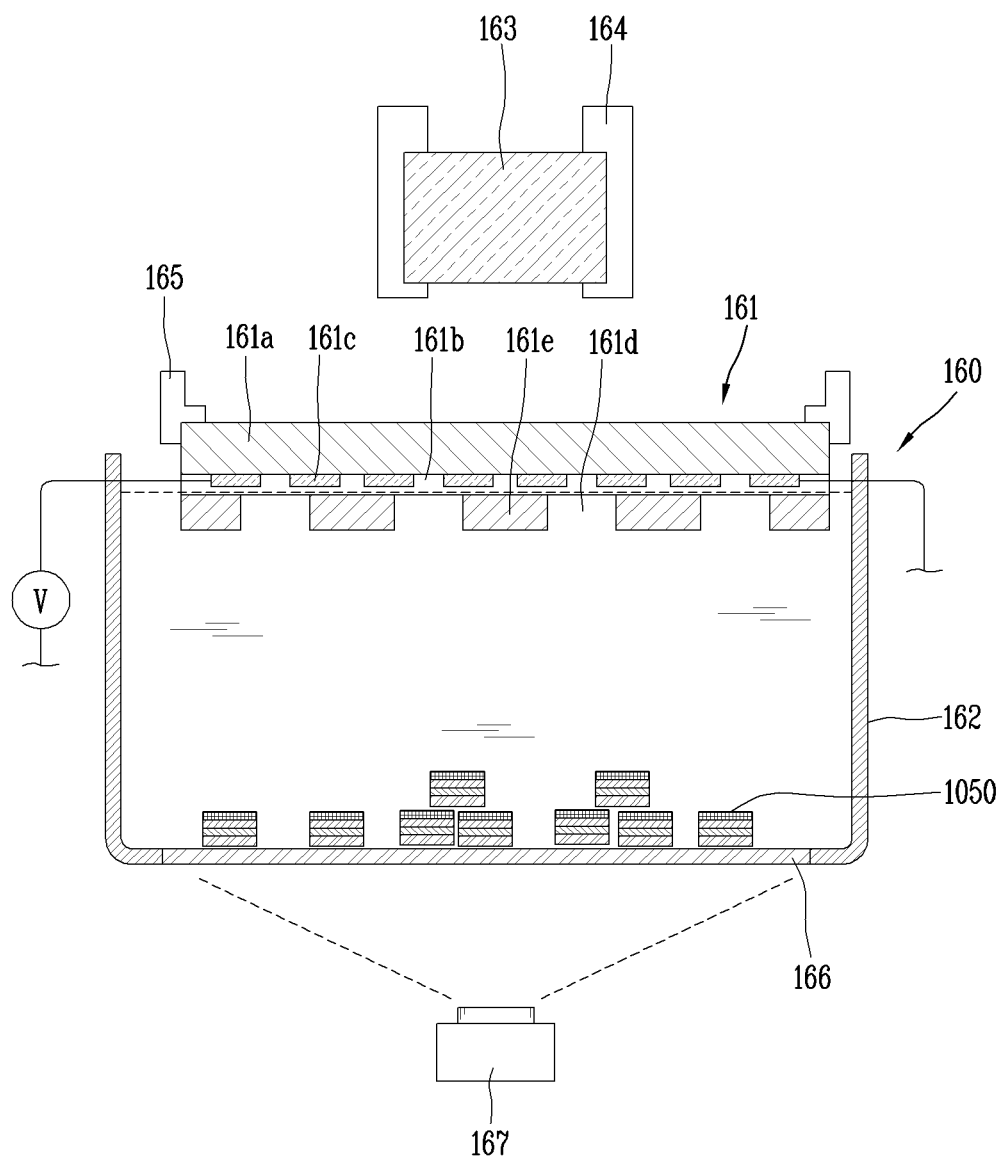
FIG. 6 is a conceptual diagram illustrating an example of a device for self-assembling semiconductor light-emitting elements.
Figure 7:
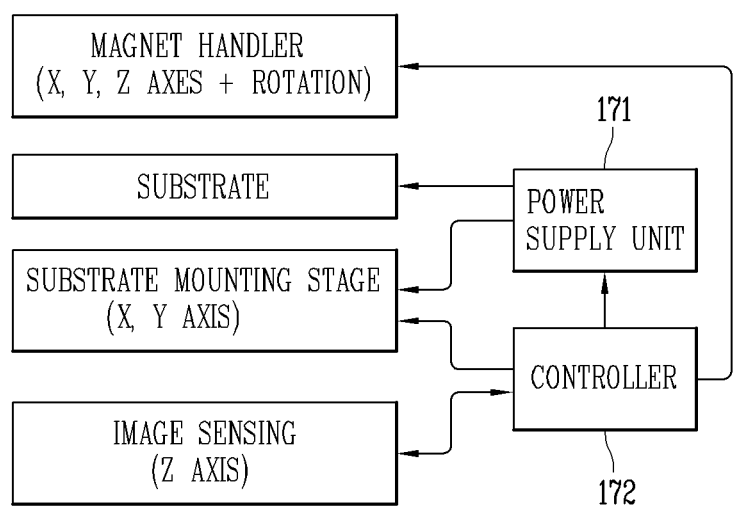
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as $SiO_2$, $SiN_x$, $SiON$, $Al_2O_3$, $TiO_2$, $HfO_2$, etc. Alternatively, the dielectric layer 161b may be an organic insulator and configured as a single layer or a multi-layer. The thickness of the dielectric layer 161b may range from several tens of nm to several μm.

Further, the substrate 161 according to the present disclosure includes a plurality of cells 161d that are separated by barrier walls. The cells 161d may be sequentially arranged in one direction and made of a polymer material. Furthermore, the barrier walls 161e defining the cells 161d may be made to be shared with neighboring cells 161d. The barrier walls 161e may protrude from the base portion 161a, and the cells 161d may be sequentially arranged in one direction by the barrier walls 161e. More specifically, the cells 161d may be sequentially arranged in column and row directions and have a matrix configuration.

As illustrated in the drawings, the cells 161d may have recesses for receiving the semiconductor light-emitting elements 150, and the recesses may be spaces defined by the barrier walls 161e. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting elements are circular. Moreover, each of the cells is configured to accommodate a single semiconductor light-emitting element. In other words, a single semiconductor light-emitting element is accommodated in a single cell.

Meanwhile, the plurality of electrodes 161c may have a plurality of electrode lines that are placed on bottoms of the cells 161d, and the plurality of electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting elements can be inserted into the cells 161d by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting element may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
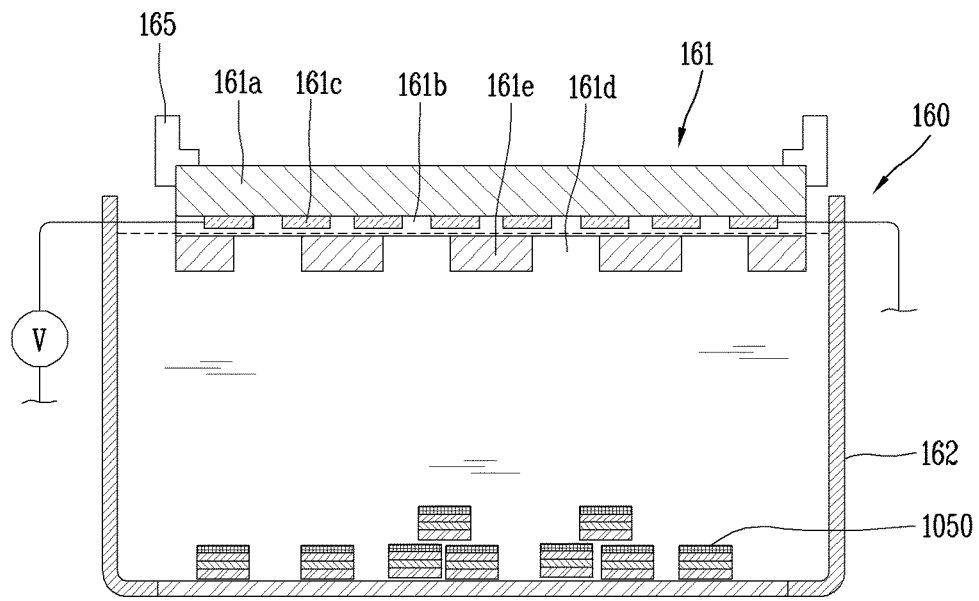
FIGS. 8A to 8E are conceptual views illustrating a process for self-assembling semiconductor light-emitting elements using the self-assembly device of FIG. 6.
Figure 9:
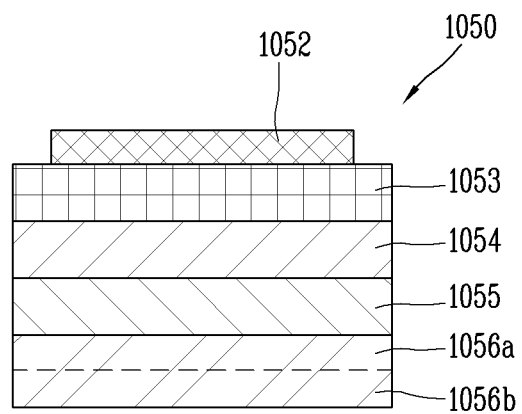
FIG. 9 is a conceptual view illustrating the semiconductor light-emitting element of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
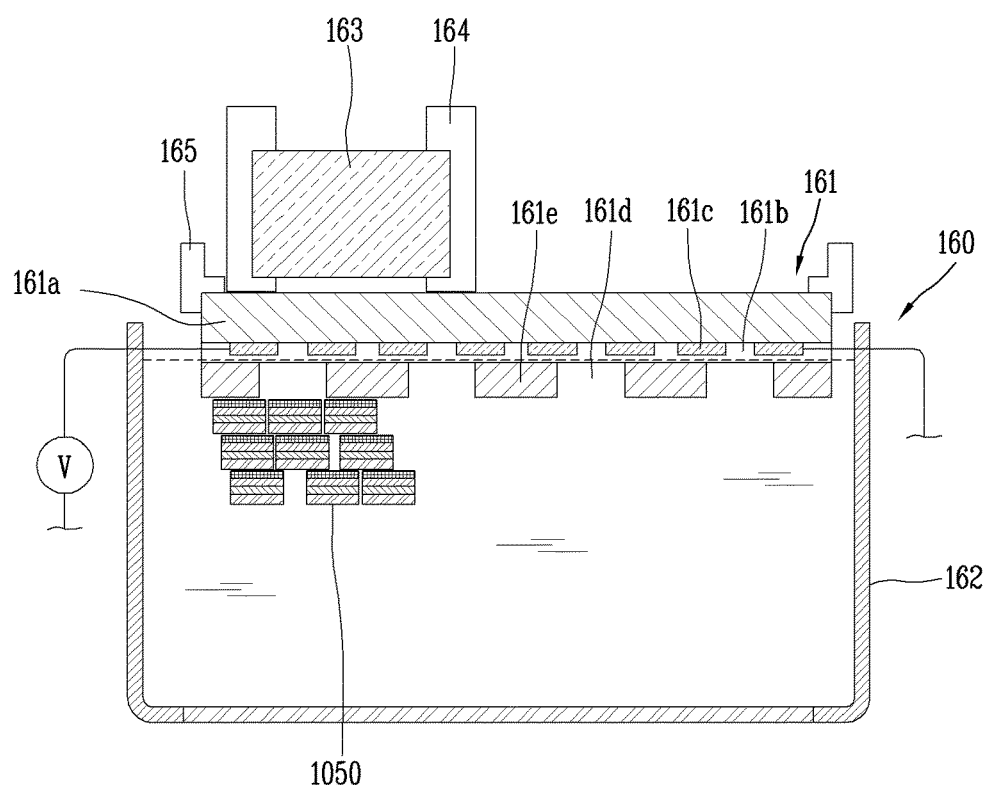

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
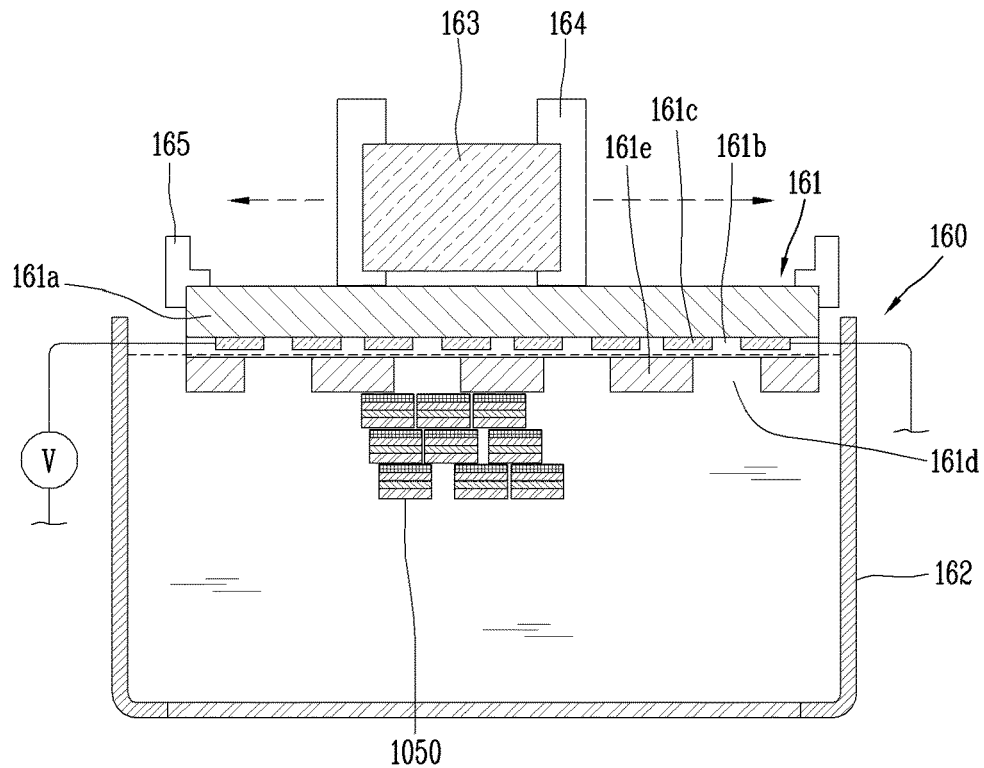

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
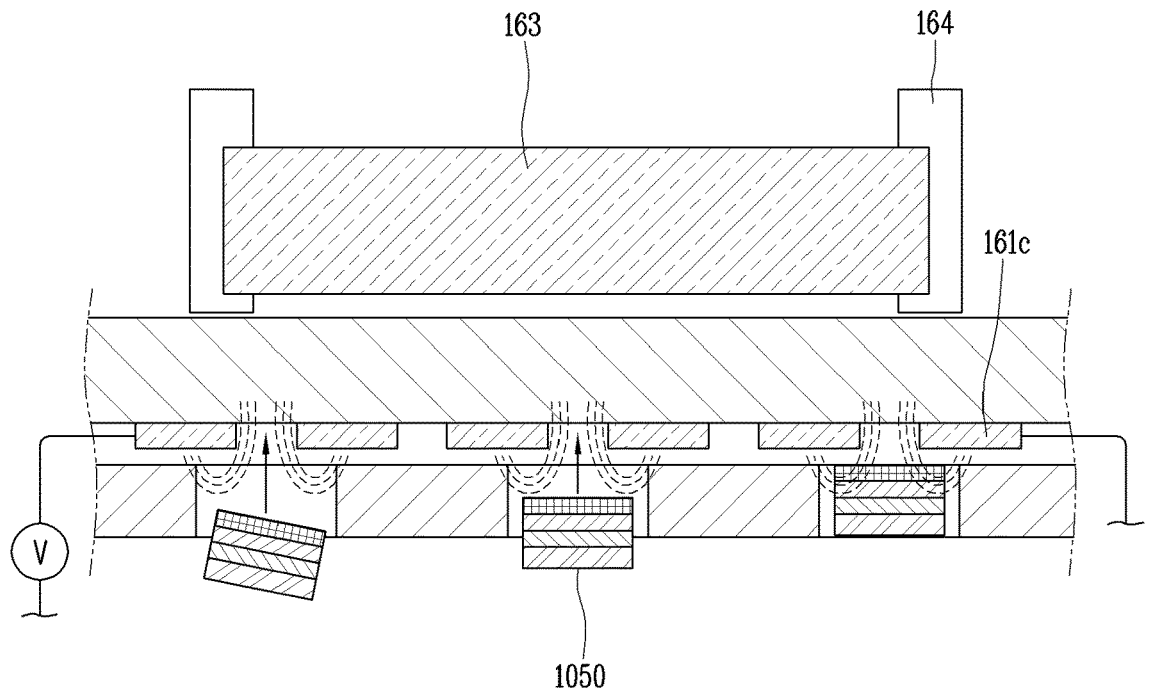
Figure 8E:
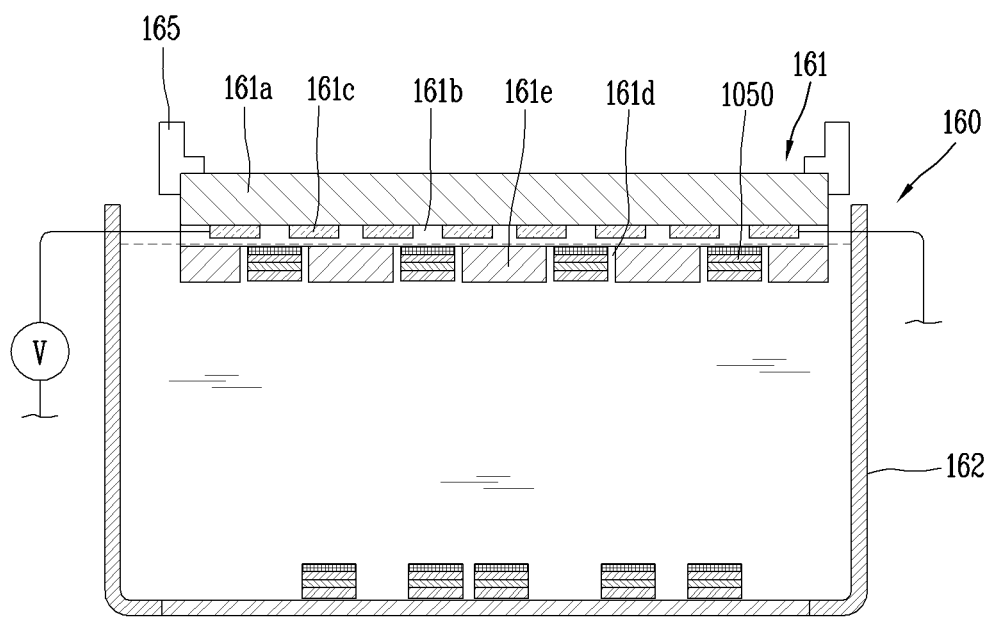

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

The present disclosure relates to a method for manufacturing a display device, and more particularly, to a novel method for distributing semiconductor light-emitting elements prior to performing the self-assembly according to FIGS. 8A to 8E in the method for manufacturing a display device.

In order to seat semiconductor light-emitting elements on a plurality of assembly sites existing on a large-area substrate in a self-assembly method, a process of distributing and supplying the semiconductor light-emitting elements to positions corresponding to the assembly sites must be preceded.

In the related art, the process of distributing and supplying the semiconductor light-emitting elements before the self-assembly has been manually performed using equipment such as a pipette or spuit. However, the method of manually supplying the semiconductor light-emitting elements has a problem in that it is not possible to control the number (amount) of semiconductor light-emitting elements supplied and it takes a long time to supply the semiconductor light-emitting elements.

Figure 10:
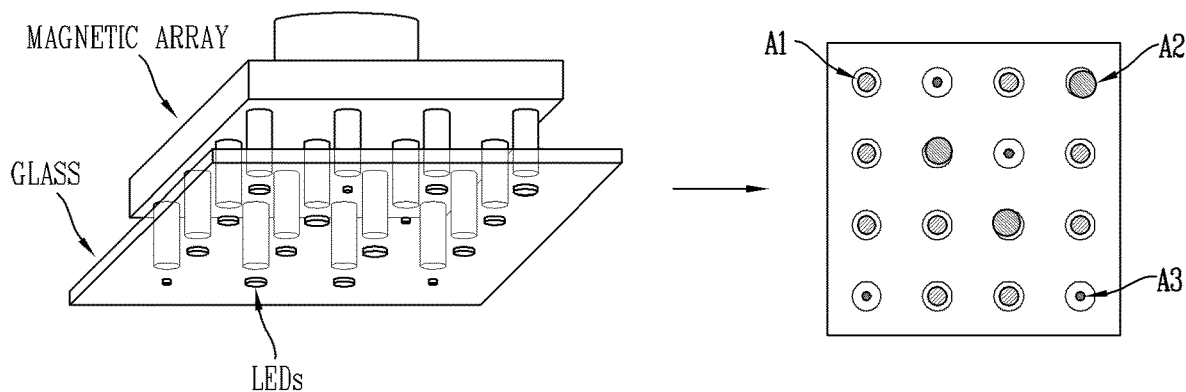
FIG. 10 is a conceptual view illustrating problems of the related art self-assembly.

FIG. 10 is a conceptual view for explaining problems of the related art self-assembly, showing a state in which semiconductor light-emitting elements that have been manually distributed and supplied in the related art are adsorbed to a magnet array with glass interposed therebetween. Referring to FIG. 10, since the semiconductor light-emitting elements were not uniformly supplied as described above, regions A1 where the semiconductor light-emitting elements are normally supplied, regions A2 where the semiconductor light-emitting elements are excessively supplied, and regions A3 where the semiconductor light-emitting elements are insufficiently supplied were mixed on a substrate, which caused assembly rate deviation within the substrate.

In detail, the regions A2 where the semiconductor light-emitting elements are excessively supplied and the regions A3 where the semiconductor light-emitting elements are insufficiently supplied have lower probabilities that the semiconductor light-emitting elements are to be assembled to the assembly sites than the regions A1 where the semiconductor light-emitting elements are normally supplied.

The present disclosure proposes a method of uniformly distributing semiconductor light-emitting elements using a distribution device having a new structure in order to uniformly supply the semiconductor light-elements to all assembly sites of a substrate. Hereinafter, an embodiment of the present disclosure will be described in more detail with reference to the accompanying drawings.

Figure 11:
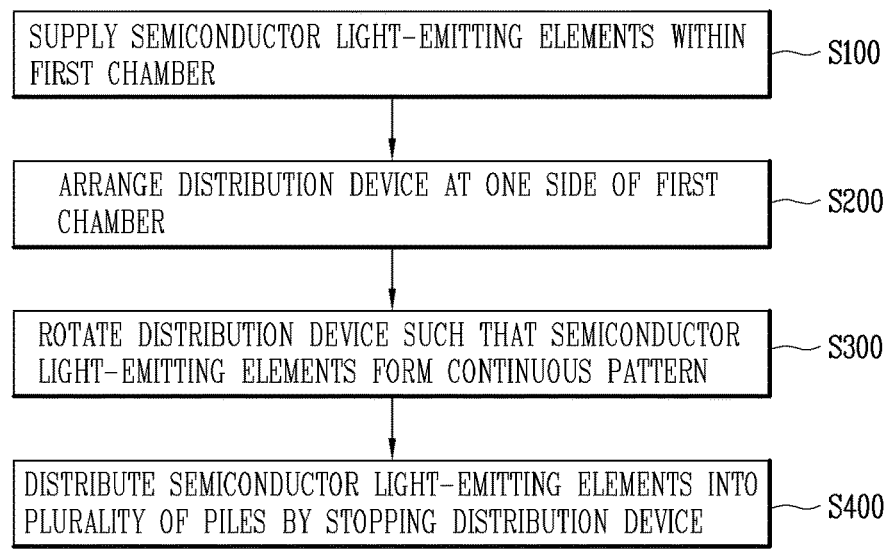
FIG. 11 is a view illustrating a process of distributing semiconductor light-emitting elements in a method of manufacturing a display device in accordance with the present disclosure.
Figure 12:
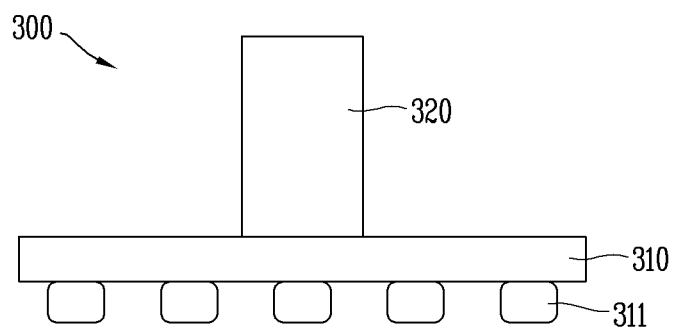
FIG. 12 is a view illustrating one embodiment of a distribution device used in the present disclosure.
Figure 13A:
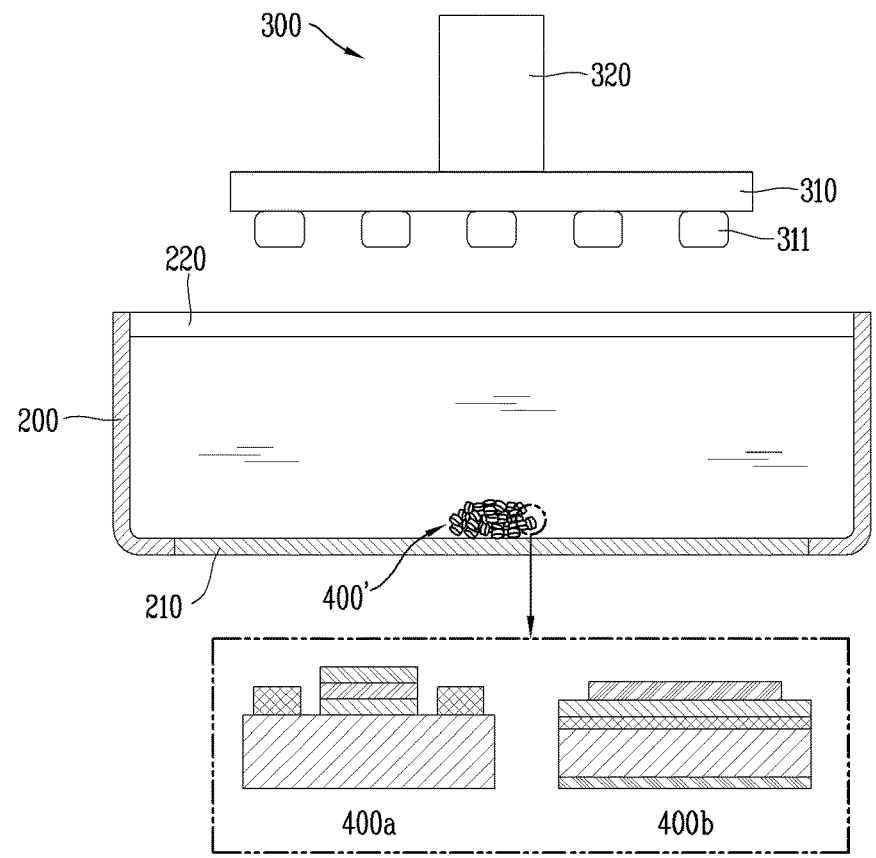
FIGS. 13A to 13D are conceptual views illustrating a method for distributing semiconductor light-emitting elements using the distribution device of FIG. 12.
Figure 13B:
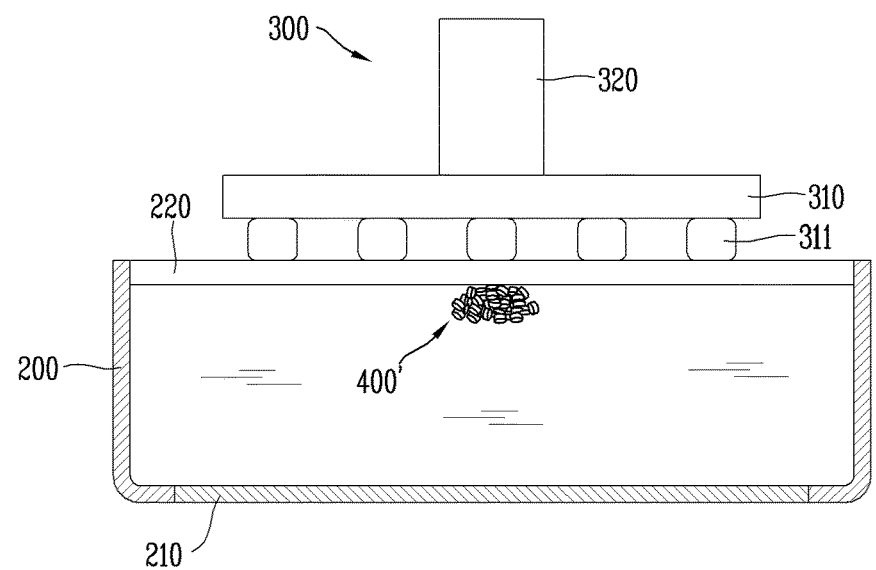
Figure 13C:
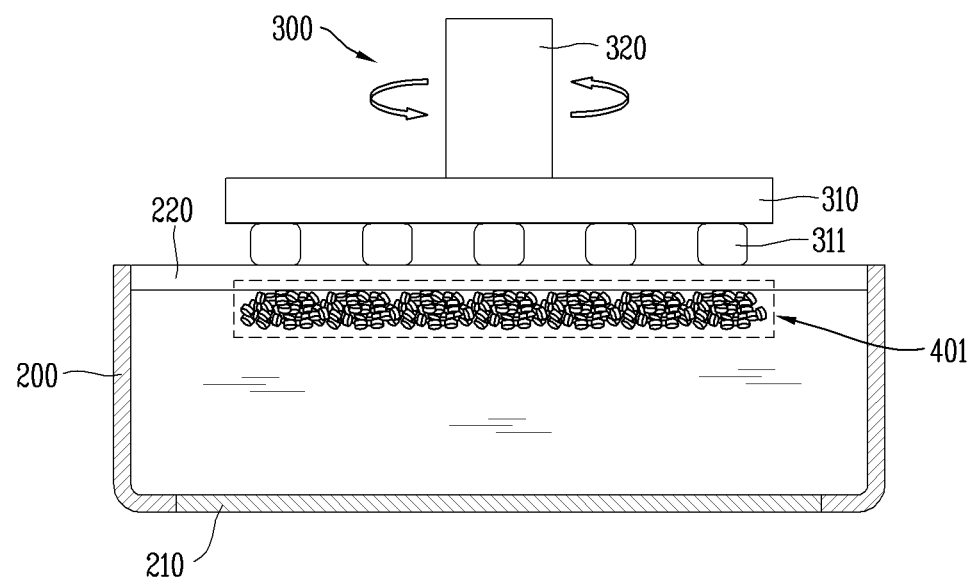
Figure 13D:
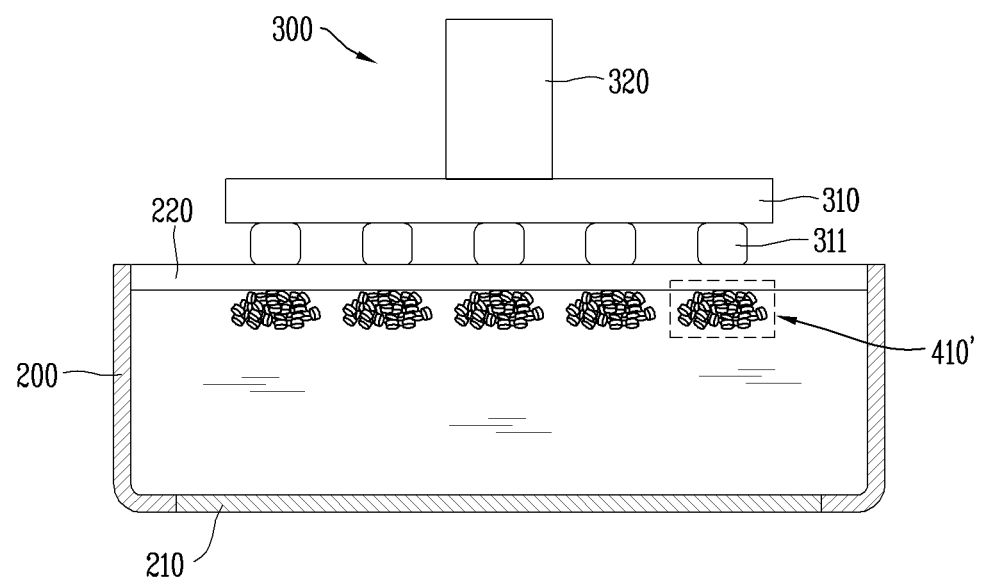
Figure 14:
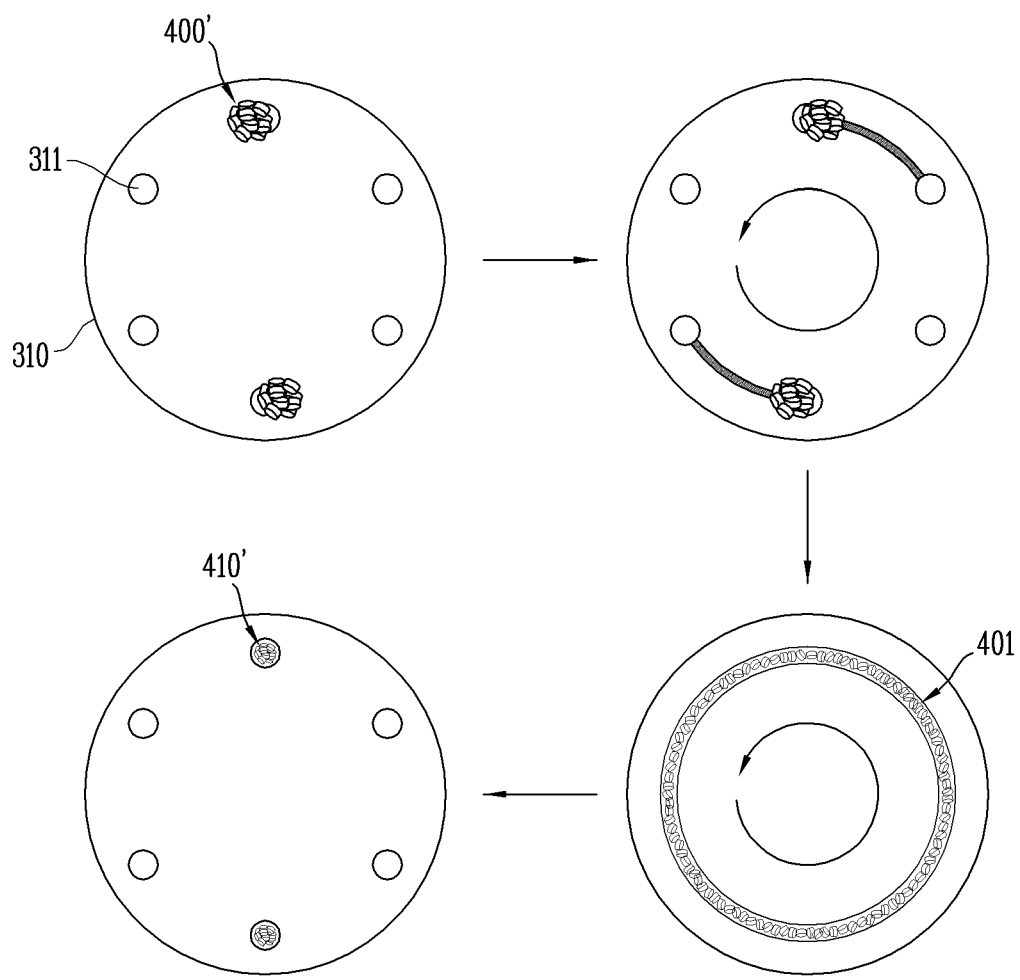
FIG. 14 is a conceptual view for explaining a process of distributing semiconductor light-emitting elements.

FIG. 11 is a view illustrating a process of distributing semiconductor light-emitting elements in a method of manufacturing a display device in accordance with the present disclosure, FIG. 12 is a view illustrating one embodiment of a distribution device used in the present disclosure, FIGS. 13A to 13D are conceptual views illustrating a method for distributing semiconductor light-emitting elements using the distribution device of FIG. 12, and FIG. 14 is a conceptual view for explaining a process of distributing semiconductor light-emitting elements.

According to the present disclosure, first, a step of supplying the semiconductor light-emitting elements 400 into a first chamber 200 which contains a fluid (S100) may be performed. The first chamber 200 may be a space in which a process of distributing the semiconductor light-emitting elements 400 according to the present disclosure is performed before the self-assembly.

The first chamber 200 may have a space in which the fluid and the semiconductor light-emitting elements 400 can be accommodated, and may be configured as an open type or a closed type. In the accompanying drawings, an embodiment in which the first chamber 200 is configured as an open type with one side open is illustrated. In addition, a bottom surface 210 of the first chamber 200 is formed of a light-transmitting transparent material, and thus it is possible to check the inside of the first chamber 200 through the bottom surface 210.

The fluid accommodated in the first chamber 200 may be water, preferably, DI water. However, the type of the fluid accommodated in the first chamber 200 is not limited thereto.

The semiconductor light-emitting elements 400 may be supplied to the first chamber 200. The semiconductor light-emitting elements 400 supplied to the first chamber 200 are semiconductor light-emitting elements each including a magnetic substance (not illustrated) and may be of a horizontal type 400a or a vertical type 400b. Structures of the horizontal type 400a and the vertical type 400b will be seen in FIG. 13A. Since the semiconductor light-emitting elements 400 include the magnetic substance, they may be induced and distributed by a distribution device 300 that includes a plurality of magnets 311 which will be described later.

According to this embodiment, the semiconductor light-emitting elements 400 may be supplied in a pile (bunch, bundle, etc.) form 400' to at least one position within the first chamber 200 (see FIG. 13A). The number of positions to which the semiconductor light-emitting elements 400 are initially supplied may be appropriately determined according to the number of magnets arranged on the distribution device 300. For example, as illustrated in the drawing, when the distribution device 300 includes five magnets 311, the semiconductor light-emitting elements 400 may be supplied in a pile form 400' to one location. On the other hand, when the distribution device 300 includes more than five magnets 311, the semiconductor light-emitting elements 400 may be supplied in the pile form 400' to at least two positions. When the number of positions where the semiconductor light-emitting elements 400 are initially supplied is smaller than the number of magnets 311 arranged on the distribution device 300, it takes a longer time to distribute the semiconductor light-emitting elements 400.

Next, a step of disposing the distribution device 300, on which the plurality of magnets 311 are arranged, at one side of the first chamber 200 (S200) may be performed. Referring to the drawing, the distribution device 300 may be disposed above the first chamber 200.

Prior to explaining this step, the structure of the distribution device 300 will be described. Referring to FIG. 12, the distribution device 300 may include a plate 310 on which a plurality of magnets 311 are arranged at predetermined distances, and a rotational shaft 320. The rotational shaft 320 may extend from a center of the plate 310 in a direction perpendicular to the plate 310. Referring to the drawing, in the distribution device 300, the plurality of magnets 311 and the rotational shaft 320 may be located on opposite sides to each other with respect to the plate 310.

According to this embodiment, the plate 310 may be formed in a circular shape as illustrated in the drawing or other shapes. The plurality of magnets 311 may be arranged along a circumference of the plate 310. For example, referring to the drawing, the plurality of magnets 311 may be arranged at equal distances along the circumference of the plate 310 so as to be placed on a circle having a smaller diameter than the plate 310.

The plurality of magnets 311 arranged on the plate 310 may be made of the same material and have the same size (diameter and thickness) for uniform distribution of the semiconductor light-emitting elements 400. For example, the plurality of magnets 311 may be permanent magnets and may have a diameter of 3 mm or more. In addition, the plurality of magnets 311 may be arranged at distances greater than the diameter of each magnet. For example, the magnets 311 each having a diameter of 5 mm may be arranged at distances of 15 to 25 mm. The plurality of magnets 311 may be provided with different specifications and numbers depending on colors emitted from the semiconductor light-emitting elements to be distributed.

In addition, although not illustrated in the drawings, the distribution device 300 according to the present disclosure may further include a component for horizontally and vertically transferring the distribution device 300 (hereinafter, a transfer unit), a component for rotating the distribution device 300 (hereinafter, a rotation unit), a component for controlling the transfer and rotation of the distributing device 300 (hereinafter, a control unit), and the like.

The distribution device 300 having such a structure may be disposed at one side of the first chamber 200, namely, above the first chamber 200 in this embodiment. Specifically, the distribution device 300 may be disposed above the first chamber 200 through the following processes.

First, a step of disposing a temporary substrate 220 made of glass on a top of the first chamber 200 may be performed. As the temporary substrate 220, a substrate having both sides flat may be used. Next, a step of arranging the distribution device 300 so that the plurality of magnets 311 face the temporary substrate 220 may be performed. Next, a step of bringing the plurality of magnets 311 into contact with the temporary substrate 220 may be performed. This step may include a process of moving the distribution device 300 down toward the temporary substrate 220, and the transfer unit and the control unit may be involved in this step.

Specifically, in this embodiment, a distance between the temporary substrate 220 and the bottom surface 210 of the first chamber 200 may be several mm, preferably 5 mm or less. When the plurality of magnets 311 are brought into contact with the temporary substrate 220 under such a distance condition, a magnetic force may be applied to the semiconductor light-emitting elements 400 supplied in the first chamber 200. The semiconductor light-emitting elements 400 may be raised in the initially supplied pile form 400' by the magnetic force, and adsorbed onto the temporary substrate 220 at a position corresponding to any one of the plurality of magnets 311 (see FIG. 13B).

Next, a step of rotating the distribution device 300 so that the semiconductor light-emitting elements 400 form a continuous pattern along an arrangement direction of the plurality of magnets 311 (S300) may be performed.

In this step, the plate 310 may be rotated in one direction (clockwise or counterclockwise) centering on the rotational shaft 320, and the rotation unit and the control unit may be involved for this purpose. While the distribution device 300 rotates, a contact state between the plurality of magnets 311 and the temporary substrate 220 may be maintained.

In this step, as the distribution device 300 rotates, the semiconductor light-emitting elements 400 may rotate together with the distribution device 300. The semiconductor light-emitting elements 400 in the pile form 400' may form a line while rotating. As the rotation continues, a continuous pattern 401 having a predetermined thickness may be formed along the circumference of the plate 310 (see FIG. 13C). According to this embodiment, the semiconductor light-emitting elements 400 may form a circular pattern along the direction in which the plurality of magnets 311 are arranged on the circumference of the plate 310. That is, this step may be performed until the semiconductor light-emitting elements 400 having the pile form 400' form the continuous pattern 401 while rotating. At this time, a rotational speed of the distribution device 300 may be determined within an appropriate range depending on the diameter of the semiconductor light-emitting element 400, the number of magnets 311, and the like.

Next, a step of stopping the distribution device 300 may be performed so that the semiconductor light-emitting elements 400 are distributed into a plurality of piles 410' (S400) may be performed. Referring to the drawing, the semiconductor light-emitting elements 400 supplied as the single pile form 400' may be distributed to the plurality of piles 410' as the distribution device 300 is stopped. The plurality of distributed piles 410' are obtained by distributing the semiconductor light-emitting elements 400 of the initially supplied pile form 400', and thus each distributed pile 410' may have a smaller volume than the initially supplied pile form 400'. The plurality of piles 410' obtained by distributing the semiconductor light-emitting elements 400 may be located at positions corresponding to the plurality of magnets 311 (see FIG. 13D). That is, the semiconductor light-emitting elements 400 which have formed the continuous pattern 401 may be maintained in an adsorbed state only on portions where the magnetic force is applied as the distribution device 300 is stopped, and accordingly distributed into the plurality of piles 410'.

On the other hand, the present disclosure may further include measuring volumes of the plurality of piles 410' to which the semiconductor light-emitting elements 400 have been distributed. In one embodiment, volume measurement may be performed using a laser beneath the bottom surface 210 of the first chamber 200. However, other measuring methods may also be applicable.

At this time, when a deviation of the measured volumes of the plurality of piles 410' is 5% or more, the step of rotating the distribution device 300 (S300) may be performed again. That is, the step of rotating the distribution device 300 (300) and the step of stopping the distribution device 300 and measuring the volumes of the plurality of distributed piles 410' may be repeatedly performed until the deviation of the measured volumes of the plurality of piles 410' is less than 5%.

Meanwhile, when the volume deviation of the plurality of distributed piles 410' is less than 5%, a step of transferring the plurality of piles 410' to a second chamber (not illustrated) in which a fluid is contained may be performed. The second chamber may be a chamber in which self-assembly is performed according to FIGS. 8A to 8E. In this step, after the distribution device 300 is separated from the temporary substrate 200, the plurality of piles 410' may be transferred to the second chamber by using a separate device that is capable of applying magnetic force. The plurality of piles 410' may be transferred to the second chamber only as many as necessary for the self-assembly.

Figure 15:
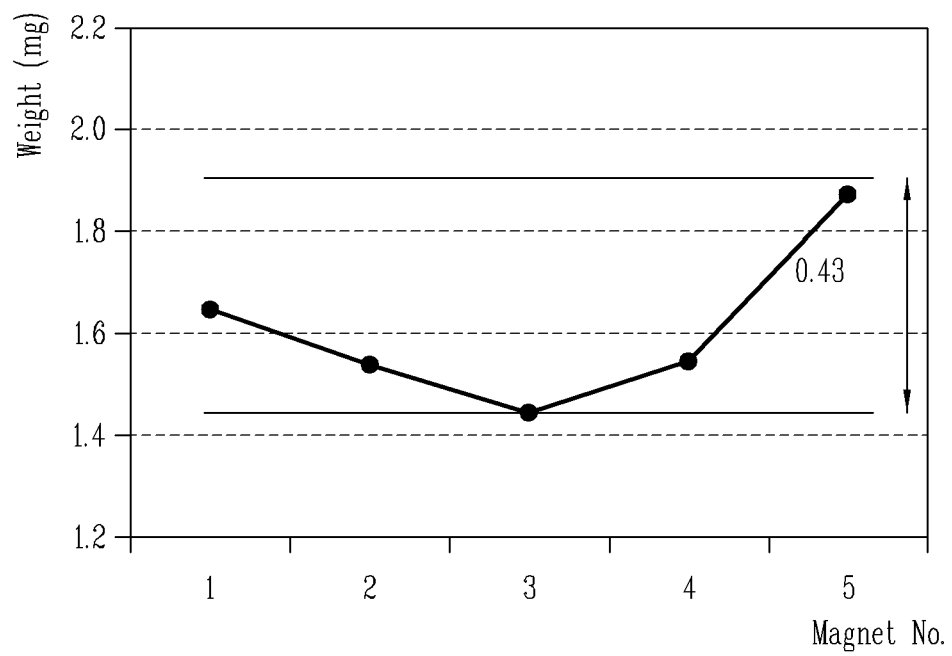
FIG. 15 is a graph showing distribution deviation of semiconductor light-emitting elements according to a process time.
Figure 15:
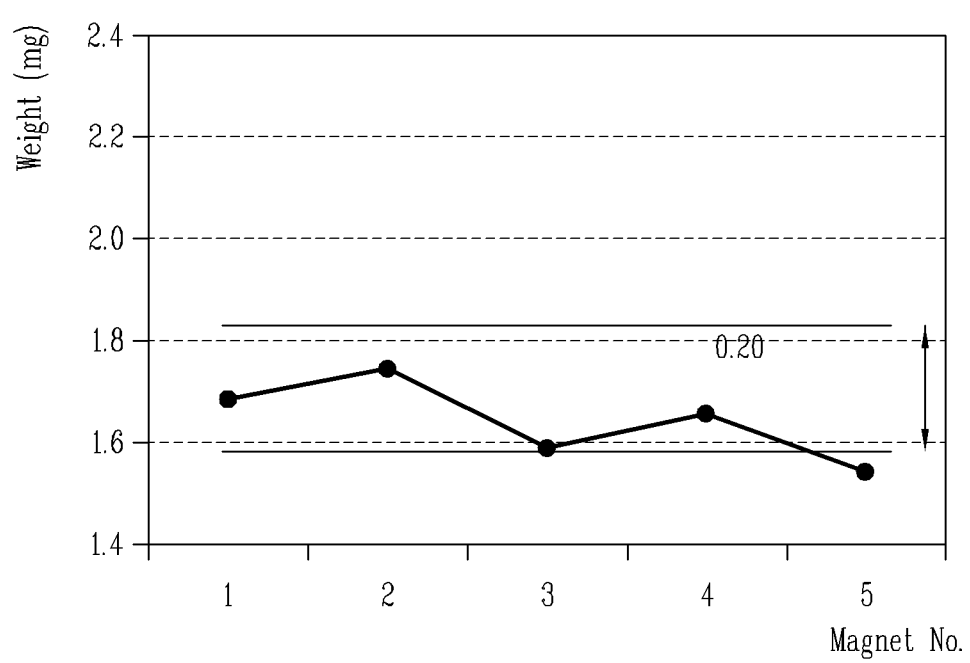

FIG. 15 is a graph showing distribution deviation of semiconductor light-emitting elements according to a process time. FIG. 15 and [Table 1] below show experimental data obtained by distributing semiconductor light-emitting elements each having a diameter of 50 μm. A distribution device on which five magnets each having a diameter of 5 mm were arranged at distances of 25 mm was used, and results obtained by rotating the distribution device at 300 rpm for 5 minutes ((a) of FIG. 15) and results obtained by rotating the distribution device at 300 rpm for 10 minutes ((b) of FIG. 15) were shown, respectively.

TABLE 1

| Division | Case A | | | | | Case B | | | | |
|---|---|---|---|---|---|---|---|---|---|---|
| Rotational speed | 300 rpm | | | | | | | | | |
| Process time | 5 min | | | | | 10 min | | | | |
| Converted weight per magnet | 1 | 2 | 3 | 4 | 5 | 1 | 2 | 3 | 4 | 5 |
|  | 1.65 | 1.54 | 1.45 | 1.55 | 1.87 | 1.69 | 1.75 | 1.59 | 1.66 | 1.55 |
| Distribution deviation | 10.15% | | | | | 4.86% | | | | |

Converted weight per magnet (mg)=Volume (laser measurement value)×Semiconductor light-emitting elements density (6.1 g/cm$^3$)

Referring to [Table 1], when the distribution device was rotated at 300 rpm for 5 minutes (Case A), the volume deviation of the piles of semiconductor light-emitting elements distributed to magnets 1 to 5 was measured to be 10.15%, whereas when the distribution device was rotated for 10 minutes under the same conditions (Case B), the volume deviation of the piles of semiconductor light-emitting elements distributed to the magnets 1 to 5 was measured to be 4.86%. According to the results, the case A has to go back to the step of rotating the distribution device again, and the case B can go to the step of transferring the plurality of distributed piles to the second chamber.

As described above, in a method for manufacturing a display device according to the present disclosure, after distributing semiconductor light-emitting elements into a plurality of piles having a deviation of less than 5%, the distributed piles are supplied to a chamber in which self-assembly is to be performed. This can allow the semiconductor light-emitting elements to be uniformly supplied to a plurality of assembly sites of a substrate and thereby improve an assembly rate deviation within a substrate. In addition, an amount of semiconductor light-emitting elements to be supplied can be controlled, for example, two or more piles can be supplied to a specific assembly site as needed. This can result in achieving an efficient self-assembly.

The above description is only an illustrative example of the technical idea of the present disclosure, and those skilled in the art will be able to make various modifications and variations without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A method for manufacturing a display device, the method comprising:
   supplying semiconductor light-emitting elements into a chamber containing a fluid;
   disposing a distribution device including a plate on which a plurality of magnets are arranged, at one side of a first chamber;
   rotating the distribution device so that the semiconductor light-emitting elements form a continuous pattern along an arrangement direction of the plurality of magnets; and
   stopping the distribution device so that the semiconductor light-emitting elements are distributed into a plurality of piles,
   wherein in the stopping the distribution device, the plurality of piles are formed at positions corresponding to the plurality of magnets, and
   wherein the plurality of magnets are arranged along a circumference of the plate.

2. The method of claim 1, wherein the plurality of magnets are arranged at predetermined distances, and the disposing the distribution device, on which the plurality of magnets are arranged, at the one side of the first chamber is performed to arrange the distribution device that includes the plate, and a rotational shaft extending from a center of the plate in a direction perpendicular to the plate.

3. The method of claim 2, wherein the disposing the distribution device, on which the plurality of magnets are arranged, at the one side of the first chamber comprises:
   disposing a temporary substrate made of glass on the one side of the first chamber;
   arranging the distribution device so that the plurality of magnets face the temporary substrate; and
   bringing the plurality of magnets into contact with temporary substrate.

4. The method of claim 2, wherein the rotating the distribution device is performed to rotate the plate in one direction centering on the rotational shaft.

5. The method of claim 2,
   wherein in the rotating the distribution device, the semiconductor light-emitting elements form a continuous pattern having a predetermined thickness along the circumference of the plate.

6. The method of claim 3, wherein a contact state between the plurality of magnets and the temporary substrate is maintained while the rotating the distribution device is in progress.

7. The method of claim 2, wherein the plurality of magnets are arranged at distances greater than a diameter of each magnet.

8. The method of claim 1, wherein the supplying semiconductor light-emitting elements into the first chamber containing a fluid is performed to supply the semiconductor light-emitting elements in a pile form to at least one position.

9. The method of claim 1, further comprising measuring volumes of the plurality of piles formed by distributing the semiconductor light-emitting elements,
   wherein the rotating the distribution device is performed again when a deviation of the measured volumes among the plurality of piles is 5% or more.

10. The method of claim 1, further comprising transferring the plurality of piles formed by distributing the semiconductor light-emitting elements to a second chamber containing a fluid.

11. The method of claim 1, wherein adjacent magnets to one magnet of the plurality of magnets are located a same distance away from the one magnet.

12. The method of claim 1, wherein a number of the plurality of magnets is even.

13. The method of claim 1, wherein each magnet of the plurality of magnets is located a same distance away from a closest edge of the plate.

14. The method of claim 1, wherein no magnet is located at a center area of the plate.

15. The method of claim 1, wherein the plurality of magnets are only located at an edge portion of the plate.

* * * * *